United States Patent [19]
Hamburgen et al.

[11] Patent Number: 6,034,430
[45] Date of Patent: *Mar. 7, 2000

[54] INTEGRATED THERMAL COUPLING FOR A HEAT GENERATING DEVICE

[75] Inventors: William R. Hamburgen, Palo Alto; John S. Fitch, Newark, both of Calif.

[73] Assignee: Digital Equipment Corporation, Maynard, Mass.

[*] Notice: This patent is subject to a terminal disclaimer.

[21] Appl. No.: 08/970,449

[22] Filed: Nov. 14, 1997

Related U.S. Application Data

[63] Continuation of application No. 08/673,976, Jul. 1, 1996, Pat. No. 5,838,065.

[51] Int. Cl.[7] .................................................. H01L 23/34
[52] U.S. Cl. .................. 257/722; 257/712; 257/713; 257/714; 257/717; 257/720; 257/724; 361/679; 361/688; 361/697; 361/702; 361/707; 361/713; 361/714
[58] Field of Search .................................. 257/712, 713, 257/714, 717, 718, 719, 720, 722; 361/679, 688, 697, 702, 703, 704, 707, 713, 714

[56] References Cited

U.S. PATENT DOCUMENTS

| | | |
|---|---|---|
| 4,800,956 | 1/1989 | Hamburgen ............................ 257/712 |
| 5,083,373 | 1/1992 | Hamburgen . | 
| 5,838,065 | 11/1998 | Hamburgen et al. ................... 257/722 |

OTHER PUBLICATIONS

IEEE, 1991, 0569–5503/91/0000–0693, "Hardware Technology for Hitachi M–880 Processor Group", F. Kobayashi t al [1991 Proceedings of the 41st Electronic Components & Technology Conference, Atlanta, Georgia], pp. i–13.

"Interleaved Fin Thermal Connectors for Multichip Modules", W. Hamburgen, WRL Research Report 91/9, Aug. 1991, Digital Equipment Corporation, Western Research Lab, 250 University Ave., Palo Alto, California 94301 USA, pp. 1–8.

*Primary Examiner*—Carl Whitehead, Jr.
*Assistant Examiner*—Matthew E. Warren
*Attorney, Agent, or Firm*—Jenkens & Gilchrist, a Professional Corporation

[57] ABSTRACT

In order to provide a thermal coupling between a heat source and a heat sink, an integrated interleaved-fin connector is provided. A first substrate includes a first side surface and a second side surface. A plurality of heat generating devices are formed in the first side surface. A plurality of first channels are etched in the second side surface to form a plurality of first fins. A second substrate has a plurality of second channels etched therein to form a plurality of second fins and a base. The base is for thermally engaging with a heat sink. The first and second fins providing a thermally conductive path from the heat generating devices to the heat sink when interleaved with each other.

12 Claims, 4 Drawing Sheets

INTEGRATED THERMAL COUPLING FOR A HEAT GENERATING DEVICE

This application is a continuation of application Ser. No. 08/673,973 filed on Jul. 1, 1996 now U.S. Pat. No. 5,838,065.

FIELD OF THE INVENTION

This invention relates generally to conductive cooling of heat generating devices, and more particularly to thermally coupling heat sources to heat sinks.

BACKGROUND OF THE INVENTION

It is a problem to remove heat from systems using densely packed, high-power devices. Many prior art systems use convection cooling to remove heat. To work efficiently, systems cooled by convection currents require means, such as fans or pumps, to move large amounts of a cooling fluid across the heat generating devices. This makes convection cooling inappropriate for compact low-profile portable computer systems equipped with high-speed CPU chips.

In compact systems, heat sinks are typically connected to the heat generating devices so that the heat can be conducted, instead of convected away. Frequently it is desired to construct the system so that the heat sink and the heat generating device can be decoupled. This makes servicing, repairing, and replacing of the heat generating devices easy.

In addition, it also desired to reduce stress at the thermal connection. The stress can be caused by differences in thermal expansion rates of the heat generating and removal components and by mechanical shock and vibration. Furthermore, in order to construct slim portable systems, the total vertical height of component assemblies must be maintained at a minimum.

In the prior art, interleaved-fin thermal connectors have been used to provide a thermal conductive path between the heat generating device and the heat removal mechanism. For example, U.S. Pat. No. 4,800,956, "Apparatus and Method for Removal of Heat from Packaged Element", and U.S. Pat. No. 5,083,373 "Method for Providing a Thermal Transfer Device for the Removal of Heat from Packaged Elements" describe thermal transfer assemblies including two sets of cooling fins. The fins can be interleaved with each other to provide a detachable thermal connection.

There are several problems with these prior art thermal connectors. First, the assembly of the elements requires several steps which do not readily admit automation. For example, the fabrication of the prior art interleaved devices requires a tape material to hold the fins in place during assembly. For example, the tape is intertwined between the fins. Next, the fins can be forced against a base plate by a jig. While held in this position, the fins can be joined to the base plate using solder. Once the fins are fixed to the base, the tape can be removed.

Second, the prior art fins and bases are made of heat conducting metals, for example, copper or specially prepared aluminum. These metals are well suited for fabrication and soldering of large scale components. However, it would be extremely difficult to make copper or prepared aluminum fins having a vertical height in the range of millimeters or less, and widths measured in terms of microns.

Even if rigid small fins and bases could be constructed, connecting the metallic fins and bases would be extremely difficult using the jigged tape and soldering methods described above. Such methods are not suited for low-cost mass production techniques.

Third, there may be differences between thermal expansion rates of the semiconductor devices and the fins and bases of the prior art assemblies. These differences would stress the joint where the assemblies are attached, leading to possible failures.

Therefore, it is desired to provide a detachable thermally conductive path from the heat source directly to the heat sink. Furthermore, the path should have a small vertical dimension. In addition, it is desired that the thermal path has freedom of movement in a maximum number of different directions.

SUMMARY OF THE INVENTION

In order to provide a direct thermal coupling between a heat source and a heat sink, an integrated interleaved-fin connector is provided. The connector comprises first and second etchable substrates. The first substrate includes a first side surface and a second side surface. A plurality of heat generating devices are formed in the first side surface. A plurality of first channels are etched in the second side surface to form a plurality of first fins. The second substrate has a plurality of second channels etched therein to form a plurality of second fins and a base. The base is for thermally engaging with a heat sink. The first and second fins provide a thermally conductive path from the heat generating devices to the heat sink when interleaved with each other.

In a preferred embodiment, the substrates are anisotropically etchable. For example, the substrates can be crystals, e.g., silicon based semiconductor substrates, polycrystals, amorphous glass, or ceramics. Furthermore, the channels are preferably wet etched at an angle which is substantially perpendicular to surfaces of the substrates. Alternatively, the channels can be dry etched using plasma or reactive ion anisotropic etching techniques. In one aspect of the invention, the first and second fins are planar and parallel to each other.

DETAILED DESCRIPTION OF PREFERRED EMBODIMENT

Figure 1:
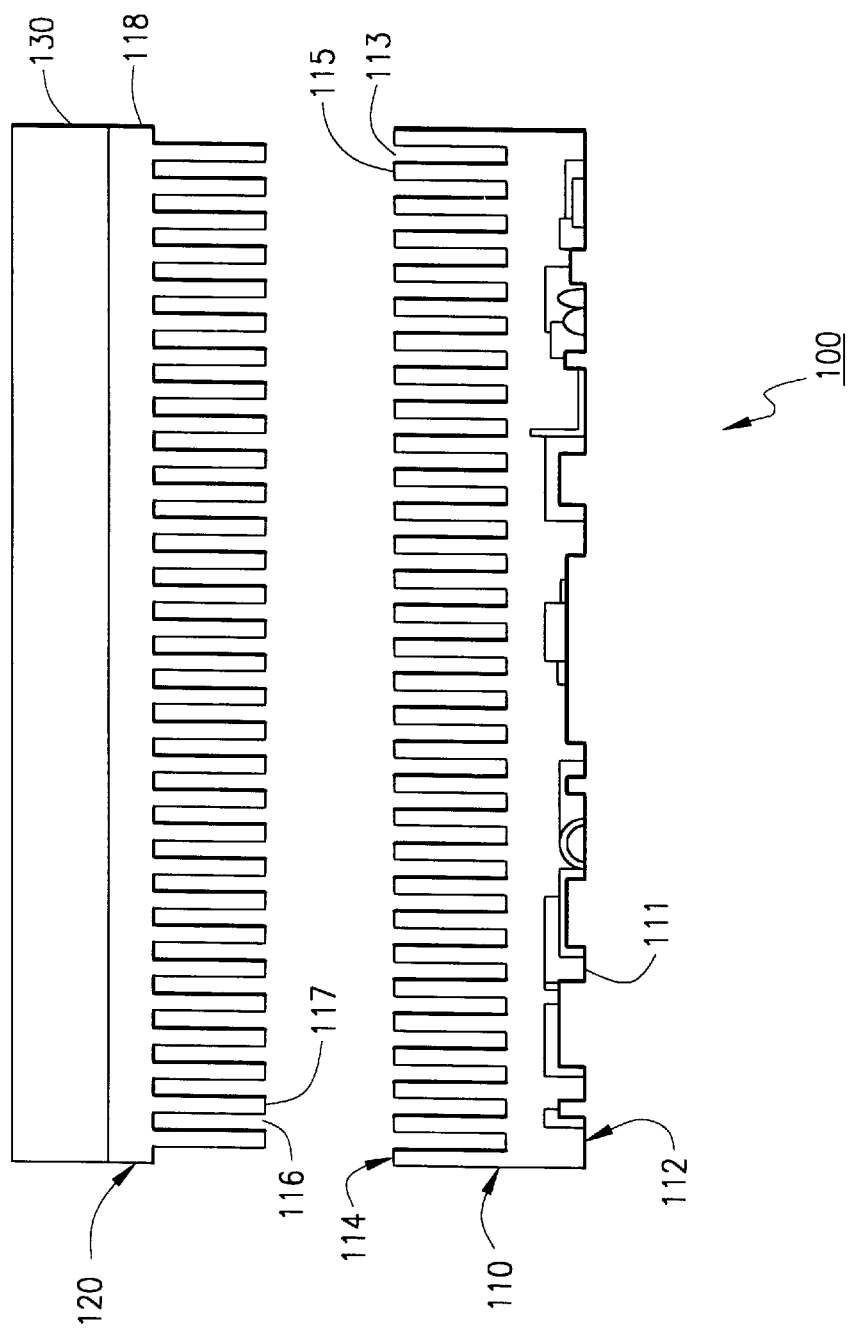
FIG. 1 is an end view of an arrangement including an integrated interleaved-fin thermal connector according to a preferred embodiment of the invention.

Now with reference to the drawings, etched and integrated interleaved-fin thermal connectors according to the preferred embodiments of the invention are described. As shown in an arrangement 100 of FIG. 1, a plurality of heat generating devices 111 are constructed on an active side surface 112 of a first substrate 110 to form a heat source.

The heat generating devices 111 can be electronic circuits, e.g., circuits of a microprocessor, micro-mechanical devices, such as motors, or radiation generating or absorbing devices, for example, lasers. In the preferred embodiment of the invention, the heat generating devices 111 are fabricated on an etchable substrate. For example, the substrate 110 can be a crystal, e.g., a silicon based semiconductor substrate or "wafer," a polycrystal, an amorphous glass substrate, or a ceramic substrate.

To ensure a normal operation, heat generated by the devices 111 must be removed. In a preferred embodiment of the invention, heat is conducted to a heat sink 130 using an integrated interleaved-fin connector.

According to the preferred embodiment, a first element of the thermal connector is integrated into the substrate 110 of the heat source as follows. A plurality of channels 113 are anisotropically etched into an inactive side surface 114 of the heat source 110. The channels 113 form a plurality of fins 115.

A second element of the connector comprises a second etchable substrate 120. The starting material for the second substrate 120 is chosen to provide a close match to the coefficient of thermal expansion of the first substrate 110. A plurality of channels 116 are etched into the second substrate 120 to form a plurality of fins 117 and a base 118. The base 116 can be thermally coupled to the heat sink 130. The thermally conductive path is completed by interleaving the fins 115 and 117 of the first and second elements.

Preferably, the fins 115 and 117 are formed in the substrates 110 and 120 using either wet or dry anisotropic etching techniques.

The starting material for the substrates 110 and 120 can be a crystal of silicon grown as an ingot. This material is readily available. Crystals are characterized by the periodic arrangement of atoms in a regularized lattice. The lattice of a silicon crystal, for example, can be represented as two interpenetrating face-centered cubic lattices. The planes of the cubic lattices typically are described by sets of three integers called the Miller indices, e.g., {100}, {111}, and {110} etc., see R. A. Latakia, *The growth of single crystals*, Prentice Hall, 1970.

The crystal's growth is strongly ordered along the "faces" of the lattice. Because of this, the strength of the bonds between co-planar atoms is many orders of magnitude greater than bonds among atoms lying in adjacent planes. This natural phenomena, exploited by the invention, leads to what are commonly known as cleavage planes.

Normally, single crystal silicon wafers are commercially available with {111} and {100} orientation of the planes of the faces, or less frequently with {110} orientation. Depending on the particular arrangement of the fins 115 and 117 desired, and the etching technique, various other orientations can be used, as described below.

Figure 2:
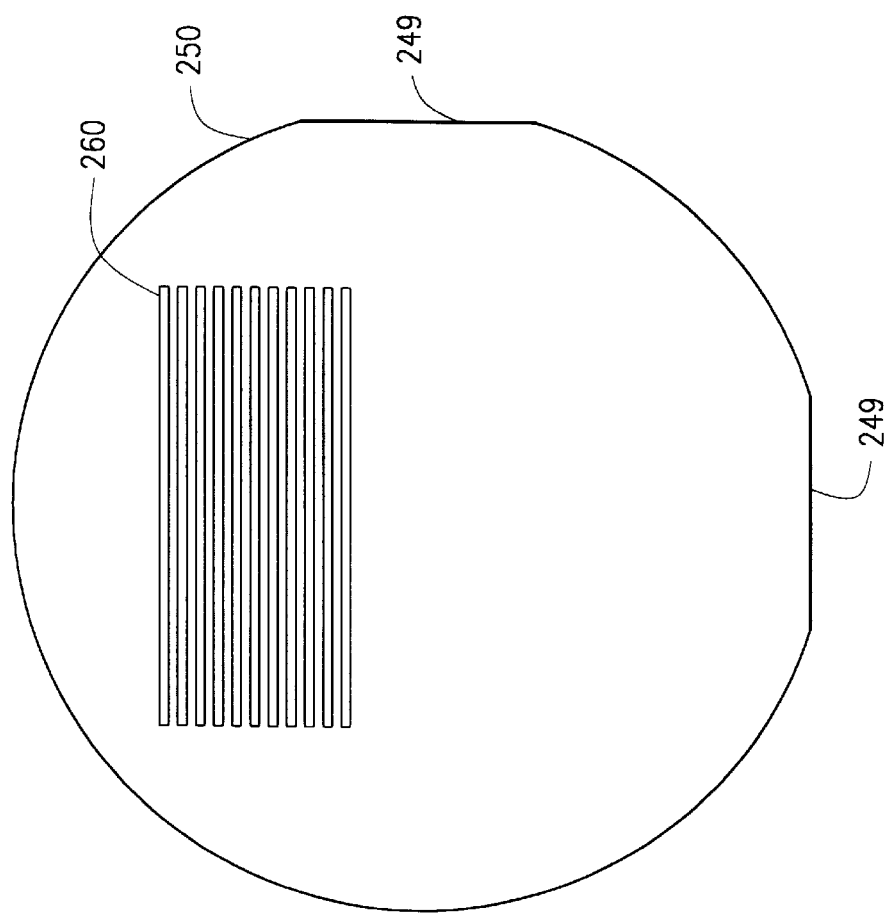
FIG. 2 is a planar view of a silicon wafer used to form the substrates of thermal connector of FIG. 1.

As shown in FIG. 2, a wafer 250 is sliced from the silicon ingot to the desired thickness. In the preferred embodiment of a low-profile connector, the finished wafers 250, after slicing and polishing have a thickness in the range of 0.5 to 1.0 millimeter for four inch standard diameter wafers. However, the invention can also be worked with wafers having other sizes. One or more flat edges 249 can be ground on the wafer to indicate the orientation of one of the lattice planes of the crystal.

The heat generating devices 111 can be formed on the active side surface 112 of the wafer using conventional semiconductor fabrication techniques. Typically, electronic circuits are created by multiple depositing and etching steps. Electro-mechanical devices can be micro-machined. Depending on the technique used, the heat generating devices 111 can be fabricated before or after the fins 115 are etched as described below.

Figure 3:
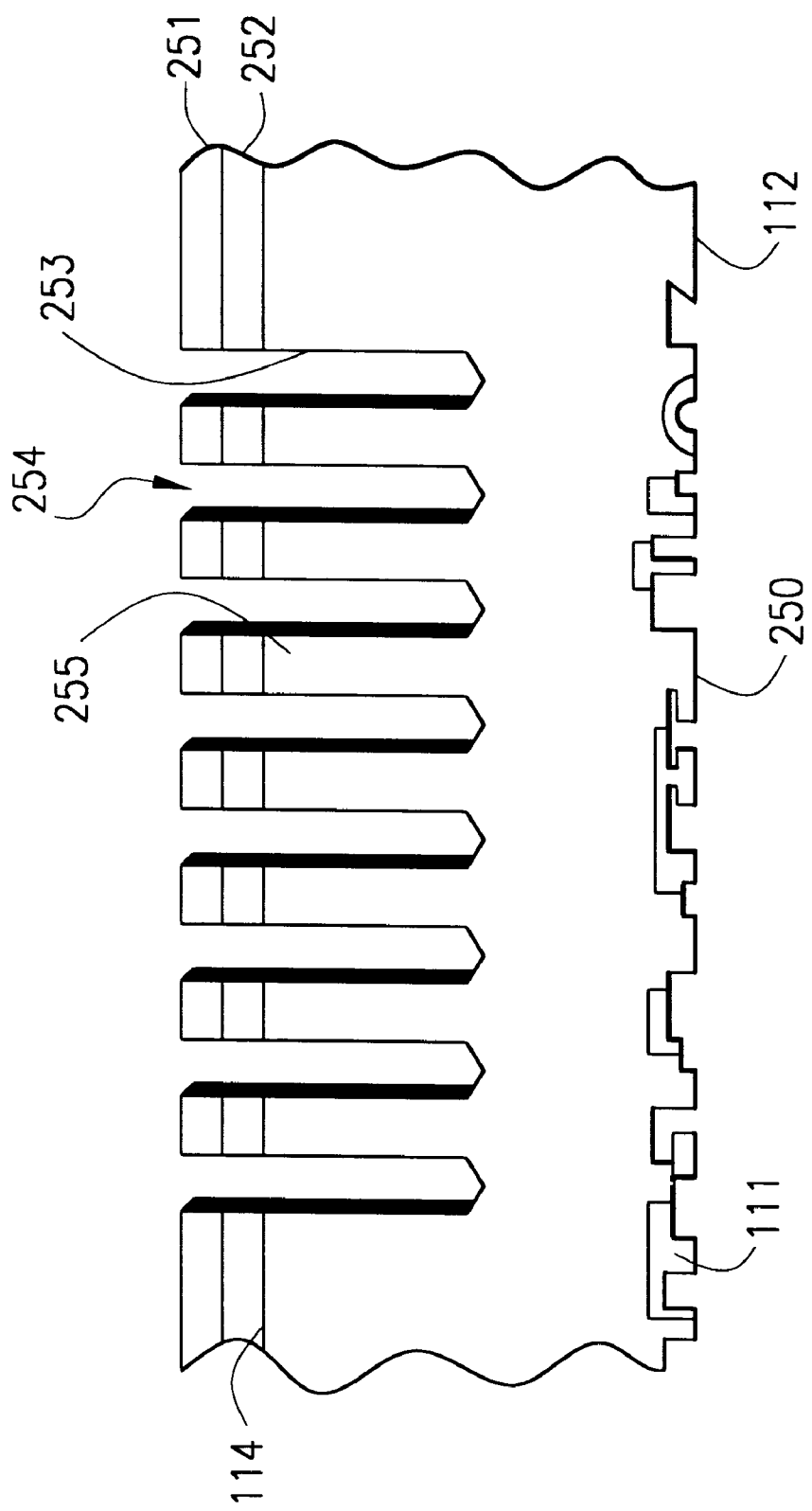
FIG. 3 is an end view of the wafer of FIG. 2 having etched fins.

Now, with reference to FIG. 3, the preparation and processing of the wafer 250 is described in greater detail. First, steam oxidation can be used to form a thin silicon dioxide ($SiO_2$) layer 252 on the inactive side surface 114 of wafer 250. The $SiO_2$ provides a stable protective film. Next, a photo-resist layer 251 is applied on the silicon oxide layer 252.

A mask, not shown, determines the desired pattern of the fins 115 of FIG. 1 to be formed in the substrate 250. For example, the partial pattern 260 shown greatly enlarged in FIG. 2. For silicon with the {110} orientation, the pattern 260 is substantially aligned with one of the {111} cleavage planes of the lattice which perpendicularly intersects the surface of the wafer 250. The orientation of one such plane is generally indicated by the flat edge 249 ground on the otherwise circular wafer 250.

Photo-lithography can be used to transfer the pattern of the mask to the photo-resist layer 251. The exposed mask is further developed and processed to remove the mask in areas where the pattern is to be etched.

Next, the exposed wafer is immersed in a bath of hydrofluoric acid to remove the protective oxide layer in the exposed area of the photoresist layer 251. After the oxide layer has been selectively removed to expose the pattern on the silicon, the rest of the mask layer 251 can be stripped.

The channels 254 which separate the fins 255 can be formed in the wafer 250 using anisotropic etching techniques. For example, in a wet etching technique for wafers having a {110} orientation, the wafer 250 is simply bathed in a heated solution of potassium hydroxide (KOH). With anisotropic etching, the etching proceeds substantially unidirectionally in a direction normal to the surface of the wafer. The $SiO_2$ protective layer 252 prevents etching of the fins 255.

As shown in FIG. 3, the anisotropic etching yields substantially vertical walls 253 of the channels 254, except in the deepest portion. The channels 254 are etched into the wafer 250 in the areas where the silicon dioxide has been removed. As an advantage of the invention, aligning the pattern 260 with the perpendicularly oriented lattice planes yields deep and narrow channels. The rate of etching in the vertical direction is several hundred times the rate of etching in the horizontal direction.

The unetched portions 255 of the wafer 250 form the fins 115 and 117 of FIG. 1. The depth of the channels 254 can be controlled by the length of time that the wafer 250 is immersed in the KOH etching solution. The width of the alternating fins and channels can be in the range of, for example, 50 to 100 microns. Once the wafer 250 has been etched, the substrates can be cut out of the wafer to appropriate sizes.

In the case of wafers having other orientations of cleavage planes, or in the case of substrates made of polycrystals, glass or ceramics, the fins 115 and 117 can be formed using plasma or reactive ion dry etching techniques. In plasma etching, a glow discharge is utilized in a partial vacuum to produce chemically reactive species, e.g., atoms, radicals, or ions, from a relatively inert gas. The gas, for example, fluorine ($CF_4$), is selected to react with the substrate. In addition to the oxide layer 252, it may be necessary to use chemical vapor deposition techniques to form a more resistant nitride protective layer on the outside of the wafer for plasma etching techniques since dry etching tends to be more corrosive than the KOH used in the wet etching described above.

As disadvantages, dry etching requires a complex reactor, and it is more difficult to produce deep vertical channels. However, as an advantage with dry etching, the pattern of the mask does not necessarily need to align with the cleavage planes of the crystal. Therefore, it is possible to have arrangements other than parallel planar fins.

Figure 4:
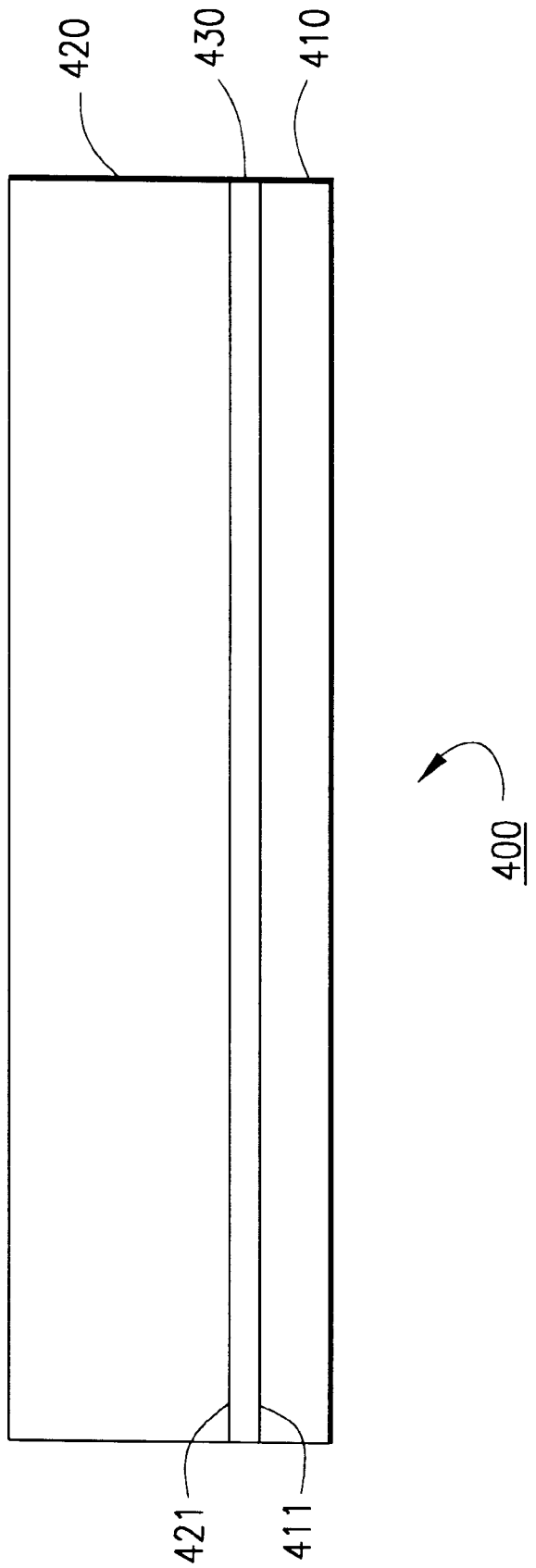
FIG. 4 is an end view of two wafers bonded to each other.

FIG. 4 shows an alternative embodiment of the integrated thermal connector according to the invention. Here, a substrate 400 includes a first part 410 bonded to a second part 420. The first part 410 is a polished wafer made of a silicon crystal having a {100} orientation. This type of crystal is typically used for fabricating semiconductor devices.

A second part 420 is made of a silicon wafer having a {110} orientation. This means that some of the cleavage planes of the crystal lattice are perpendicular to the side surface of the wafer. The thickness of the second part can be several orders of magnitude greater than the thickness of the first part 410. One side surface 421 is also polished to a high degree of flatness.

The two parts can be joined together by a bond 430. The bond 430 can be formed by separately exposing the surfaces 411 and 421 to be bonded to an oxidizing agent in a near vacuum at a high temperature, e.g. about 1000° Centigrade. This forms a silicon dioxide layer having a thickness measured in atomic units. Once the surfaces 411 and 421 have been oxidized, they can be placed in contact with each other to form a single silicon dioxide bond. The strength of this bond can be further increased by annealing the assembly at elevated temperatures (>300° C.). After annealing, the part 410 can be thinned by grinding and polishing.

The heat generating devices 111 can be formed on the part 410, and the fins can be etched on the part 420. Depending on the processing sequence, it may be necessary to protect the heat generating devices 111 during fin etching.

Specific implementations of the invention have been described with respect to an integrated heat connector of a heat generating device. It should be noted that other orientations of fins can also be used. For example, the fins can be arranged as concentric cylindrical fins to allow a relative rotation between the heat source and the heat sink.

Additional etched finned couplings can be placed between the source and sink to achieve additional degrees of freedom of movement. Those familiar with the art will appreciate that it may be practiced in other ways while still remaining within the scope and spirit of the appended claims.

We claim:

1. An apparatus for thermally coupling a heat source to a heat sink, comprising:

a first substrate including a first side surface and a second side surface, a plurality of heat generating devices formed in the first side surface, and a plurality of first channels formed in the second side surface to form a plurality of first fins;

a second substrate having a plurality of second channels formed therein to form a plurality of second fins and a base for thermally engaging with a heat sink, the first and second fins providing a thermally conductive path from the heat generating device to the heat sink when interleaved with each other.

2. The apparatus of claim 1 wherein the first and second substrates are made of a silicon crystal.

3. The apparatus of claim 2 wherein the first and second channels are formed along planes perpendicular to the first and second surfaces.

4. The apparatus of claim 4 wherein the first and second substrates are made of a polycrystal.

5. The apparatus of claim 4 wherein the dry etching uses plasma.

6. The apparatus of claim 1 wherein the first and second fins are planar and parallel to each other.

7. The apparatus of claim 1 wherein the first substrate further comprises:

a first part made of a silicon crystal having a lattice orientation to form the plurality of heat generating devices;

a second part made of a silicon crystal having a lattice orientation to form the plurality of fins, said first and second part joined to each other by a bond.

8. The apparatus as of claim 7 wherein the bond is one of a silicon dioxide and diffusion bond.

9. The apparatus of claim 1 wherein the heat generating devices are electrically powered.

10. The apparatus of claim 1, wherein at least one of the first and the second channels is one of etched, anisotropically etched and wet etched.

11. The apparatus of claim 1, wherein at least one of the first and second channels is dry etched.

12. The apparatus of claim 11, wherein the dry etching is performed using reactive ions.

* * * * *